United States Patent
Wong et al.

(10) Patent No.: US 12,298,822 B2
(45) Date of Patent: May 13, 2025

(54) AUTOMATED SYSTEM AND METHOD FOR INSERTING MEMORY MODULES INTO MOTHERBOARDS

(71) Applicant: Google LLC, Mountain View, CA (US)

(72) Inventors: Suk Wong, Sammamish, WA (US); Umakaran Nemallan, Mississauga (CA); Ryan Schiller, Seattle, WA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/407,949

(22) Filed: Jan. 9, 2024

(65) Prior Publication Data
US 2024/0143046 A1    May 2, 2024

Related U.S. Application Data

(62) Division of application No. 17/349,418, filed on Jun. 16, 2021, now Pat. No. 11,899,512.

(51) Int. Cl.
*G06F 1/18* (2006.01)
*H05K 13/04* (2006.01)

(52) U.S. Cl.
CPC ............ *G06F 1/186* (2013.01); *H05K 13/04* (2013.01)

(58) Field of Classification Search
CPC .......... G01F 1/185; G01F 1/186; H05K 13/04
See application file for complete search history.

(56) References Cited

U.S. PATENT DOCUMENTS

| | | | |
|---|---|---|---|
| 4,620,756 A | 11/1986 | Gatti et al. | |
| 6,896,534 B2 | 5/2005 | Ruckerbauer | |
| 6,993,834 B2 | 2/2006 | Boyd et al. | |
| 7,245,499 B2 | 7/2007 | Stahl et al. | |
| 7,344,402 B2 | 3/2008 | Langgood et al. | |
| 7,394,149 B2 | 7/2008 | Clayton et al. | |
| 7,396,244 B1 | 7/2008 | Barna et al. | |
| 7,500,863 B2 | 3/2009 | Ringler et al. | |
| 7,955,098 B1 | 6/2011 | McKee et al. | |

(Continued)

FOREIGN PATENT DOCUMENTS

| | | |
|---|---|---|
| CN | 112148085 A | 12/2020 |
| EP | 3910640 A1 | 11/2021 |
| JP | 2005302423 A | 10/2005 |

OTHER PUBLICATIONS

Extended European Search Report for European Patent Application No. 22156418.0 dated Aug. 3, 2022. 10 pages.

*Primary Examiner* — Livius R. Cazan
(74) *Attorney, Agent, or Firm* — Lerner David LLP (57) ABSTRACT

The technology relates to a memory insertion apparatus for pushing memory modules into corresponding memory sockets on a circuit board. The memory insertion apparatus may include a frame and an actuation assembly coupled to the frame, and one or more cam assemblies each rotatably coupled to the frame and operatively coupled to the actuation assembly. Each cam assembly may include a central shaft extending in a longitudinal direction, and a plurality of cams each having a tip configured to engage one of the memory modules, the tip extending from the central shaft in a respective radial direction perpendicular to the longitudinal direction. A center of each cam may be offset from centers of adjacent ones of the cams by a pitch distance that is about equal to a pitch distance between centers of adjacent ones of the memory sockets.

15 Claims, 5 Drawing Sheets

(56) References Cited

U.S. PATENT DOCUMENTS

| | | |
|---|---|---|
| 7,997,913 B2 | 8/2011 | Ida et al. |
| 8,182,289 B2 | 5/2012 | Stokoe et al. |
| 8,817,458 B2 | 8/2014 | Clayton et al. |
| 9,335,337 B2 | 5/2016 | Jones et al. |
| 9,746,879 B2 | 8/2017 | Clayton et al. |
| 9,894,820 B1 | 2/2018 | Bautista, Sr. et al. |
| 10,034,420 B2 | 7/2018 | DeCesaris et al. |
| 10,314,219 B2 | 6/2019 | Casserly et al. |
| 2006/0185159 A1 | 8/2006 | Correll et al. |
| 2014/0111931 A1 | 4/2014 | Casserly et al. |
| 2015/0245529 A1 | 8/2015 | Tam et al. |
| 2020/0068757 A1 | 2/2020 | Hughes et al. |
| 2021/0356937 A1* | 11/2021 | Reichenbach ............ G01L 1/22 |

* cited by examiner

AUTOMATED SYSTEM AND METHOD FOR INSERTING MEMORY MODULES INTO MOTHERBOARDS

CROSS-REFERENCE TO RELATED APPLICATIONS

The present application is a divisional of U.S. patent application Ser. No. 17/349,418, filed on Jun. 16, 2021, the disclosure of which is incorporated herein by reference.

BACKGROUND

Modern computing devices require large amounts of high-speed memory, such as DDR3 or DDR4, to operate at peak performance. Given the limited capacity of each memory module, these computing devices typically rely on several memory modules such as 16, 24, 32, or more memory modules to provide the high-speed memory they require to operate. The proper installation of these memory modules into the computing devices is essential to ensuring the computing devices have access to the high-speed memory that they require.

The current motion of installation of memory modules into computing devices may produce an elevated strain rate, which may result in damage to the memory module, the memory socket, and/or the circuit board. Accurately pushing DIMMs or other large components on electronic boards requires a balance between insertion force to ensure complete insertion and subsequent stress induced on the PCB.

Manually installing memory modules according to conventional techniques also may be labor intensive. In enterprise and manufacturing environments, hundreds, thousands, tens of thousands, or more memory modules may be installed. Systems that automate the installation process may decrease the installation time of memory modules, but both manual and automated installation may be prone to errors. These errors may include the use of too much force during insertion of a memory module into a memory socket, which may lead to broken components such as broken circuit boards, memory modules, and memory sockets. Moreover, improper installation of a memory module may lead to system failures or sub-par operation of the system. For example, memory modules that are not seated properly in a memory socket may cause the system to short-circuit. In some instances, improperly seated memory modules, which would otherwise be operational if seated properly, may be unavailable for use by the system. Additionally, troubleshooting improperly installed memory modules in systems that have a large number of memory modules may take a significant amount of time.

BRIEF SUMMARY

The present disclosure provides for an apparatus and method for inserting memory modules, such as Dual Inline Memory Modules (DIMM), into memory sockets.

One aspect of the disclosure provides a memory insertion apparatus configured to push memory modules into corresponding memory sockets. The memory insertion apparatus may include a frame and an actuation assembly coupled to the frame, and one or more cam assemblies each rotatably coupled to the frame and operatively coupled to the actuation assembly. Each cam assembly may have a central shaft extending in a longitudinal direction, and a plurality of cams each having a tip configured to engage one of the memory modules, the tip extending from the central shaft in a respective radial direction perpendicular to the longitudinal direction. A center of each cam of each of the cam assemblies may be offset from centers of adjacent ones of the cams by a pitch distance that is about equal to a pitch distance between centers of adjacent ones of the memory sockets.

Each of the cams may have a rounded generally triangular shape. The actuation assembly may include a motor, pulleys including a drive pulley and one or more cam assembly pulleys, each cam assembly pulley corresponding to one of the one or more cam assemblies, and a belt extending at least partially around an outer circumference of each of the pulleys, the motor being configured to rotate the drive pulleys, each of the one or more cam assembly pulleys being rotatably fixed to a respective one of the one or more cam assemblies, such that rotation of the one or more cam assembly pulleys rotates the respective cam assembly in a same rotational direction. The memory insertion apparatus may also include a non-contact measuring device that is configured to measure a distance between the cam assemblies and the memory modules.

Each of the cam assemblies may include eight cams. The tip of each cam may include a ball bearing concentrically located by a dowel pin. The tip of each cam may include a compliant material that is configured to partially compress when an external force is applied thereto. Each of the one or more cam assemblies may include an identical number and arrangement of the cams.

The one or more cam assemblies may include a first cam assembly and a second cam assembly, and the first cam assembly may be rotationally offset 45° to 90° relative to the second cam assembly, such that when each cam assembly is rotated in a same rotational direction, a center of each cam of the first cam assembly passes through a first vertically oriented contact position 45° to 90° before a center of each corresponding cam of the second cam assembly passes through a second vertically oriented contact position.

The one or more cam assemblies may include a first cam assembly and a second cam assembly, and the first cam assembly may be rotationally aligned in a same orientation relative to the second cam assembly, such that when each cam assembly is rotated in a same rotational direction, a center of each cam of the first cam assembly passes through a first vertically oriented contact position simultaneously with when a center of each corresponding cam of the second cam assembly passes through a second vertically oriented contact position. The one or more cam assemblies may together be configured to cooperatively perform a rocking push-in of each of the memory modules into the corresponding memory sockets, such that a first end of each of the memory modules is pushed before a second end thereof.

Each cam of each of the one or more cam assemblies may be offset from an adjacent one of the cams by 120° to 240° about a circumference of the central shaft. The cams of each of the one or more cam assemblies may be arranged in a sequence having odd-numbered and even-numbered ones of the cams. Each odd-numbered cam of each of the cam assemblies may be offset from a closest one of the odd-numbered cams by 15° to 45° about a circumference of the central shaft. Each even-numbered cam of each of the cam assemblies may be offset from a closest one of the even-numbered cams by 15° to 45° about a circumference of the central shaft.

The one or more cam assemblies may together be configured to cooperatively perform an in-phase push-in of each of the memory modules into the corresponding memory sockets, such that a first end and a second end of each of the memory modules is pushed simultaneously. Each cam of each of the one or more cam assemblies may be offset from an adjacent one of the cams by 15° to 45° about a circumference of the central shaft.

Another aspect of the disclosure provides method for pushing memory modules into corresponding memory sockets with an automated memory insertion apparatus. The method may include rotating one or more cam assemblies relative to a frame, each cam assembly having a central shaft extending in a longitudinal direction and a plurality of cams each extending from the central shaft in a respective radial direction perpendicular to the longitudinal direction, a center of each cam of each of the cam assemblies being offset from centers of adjacent ones of the cams by a pitch distance that is about equal to a pitch distance between centers of adjacent ones of the memory sockets. The method may also include applying, by the cams, an insertion force to the memory modules in the corresponding memory sockets, no more than two of the cams applying the insertion force at any time.

The applying may include the one or more cam assemblies together cooperatively performing a rocking push-in of each of the memory modules into the corresponding memory sockets, such that a first end of each of the memory modules is pushed before a second end thereof. The one or more cam assemblies may include a first cam assembly and a second cam assembly, and the first cam assembly may be rotationally offset relative to the second cam assembly, such that during the rotating, each cam of the first cam assembly contacts a first end of a corresponding one of the memory modules before a corresponding cam of the second cam assembly contacts a second end of the corresponding one of the memory modules. Each cam of each of the cam assemblies may be offset from an adjacent one of the cams by 120° to 240° about a circumference of the central shaft, such that during the applying, in a sequence a group of the memory modules, all odd-numbered memory modules in the sequence are inserted into the corresponding memory sockets before any of the even-numbered memory modules in the sequence are inserted into the corresponding memory sockets.

The applying may include the one or more cam assemblies together cooperatively performing an in-phase push-in of each of the memory modules into the corresponding memory sockets, such that a first end and a second end of each of the memory modules is pushed simultaneously. The one or more cam assemblies may include a first cam assembly and a second cam assembly, and the first cam assembly may be rotationally aligned in a same orientation relative to the second cam assembly, such that during the rotating, each cam of the first cam assembly contacts a first end of a corresponding one of the memory modules simultaneously with when a corresponding cam of the second cam assembly contacts a second end of the corresponding one of the memory modules.

DETAILED DESCRIPTION

The technology relates generally to a device for inserting memory modules, such as Dual Inline Memory Modules (DIMM), into memory sockets. The invention uses a series of offset cams that are closely packed and in phase with their neighbors to allow rotation motion of the cam assembly to actuate the pressing action. Each cam is made of a compliant material, e.g., rubber, and a stainless-steel sleeve on rollers to act as a pushing surface. This allows the system to push multiple DIMMs into corresponding memory sockets without exceeding force limits on the motherboards, and the compliance of the cams provided by the via the complaint material permits the memory insertion apparatus to compensate for a tolerance stack up that produces a height variation of the memory sockets.

Figure 1:
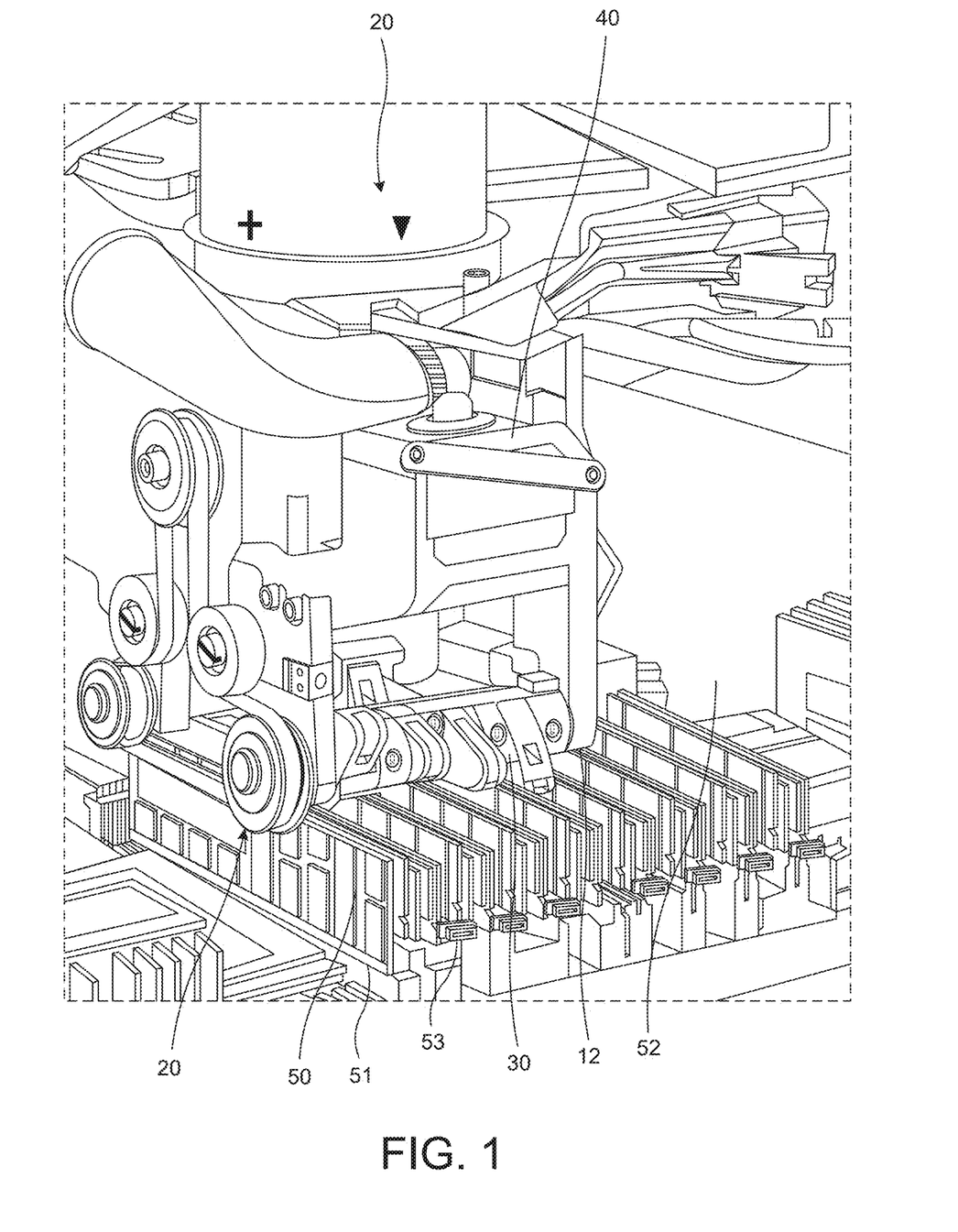
FIG. 1 shows a top perspective view of a memory insertion apparatus pushing a memory module into a memory socket mounted to a circuit board, in accordance with aspects of the disclosure.
Figures 2, 3, 4:
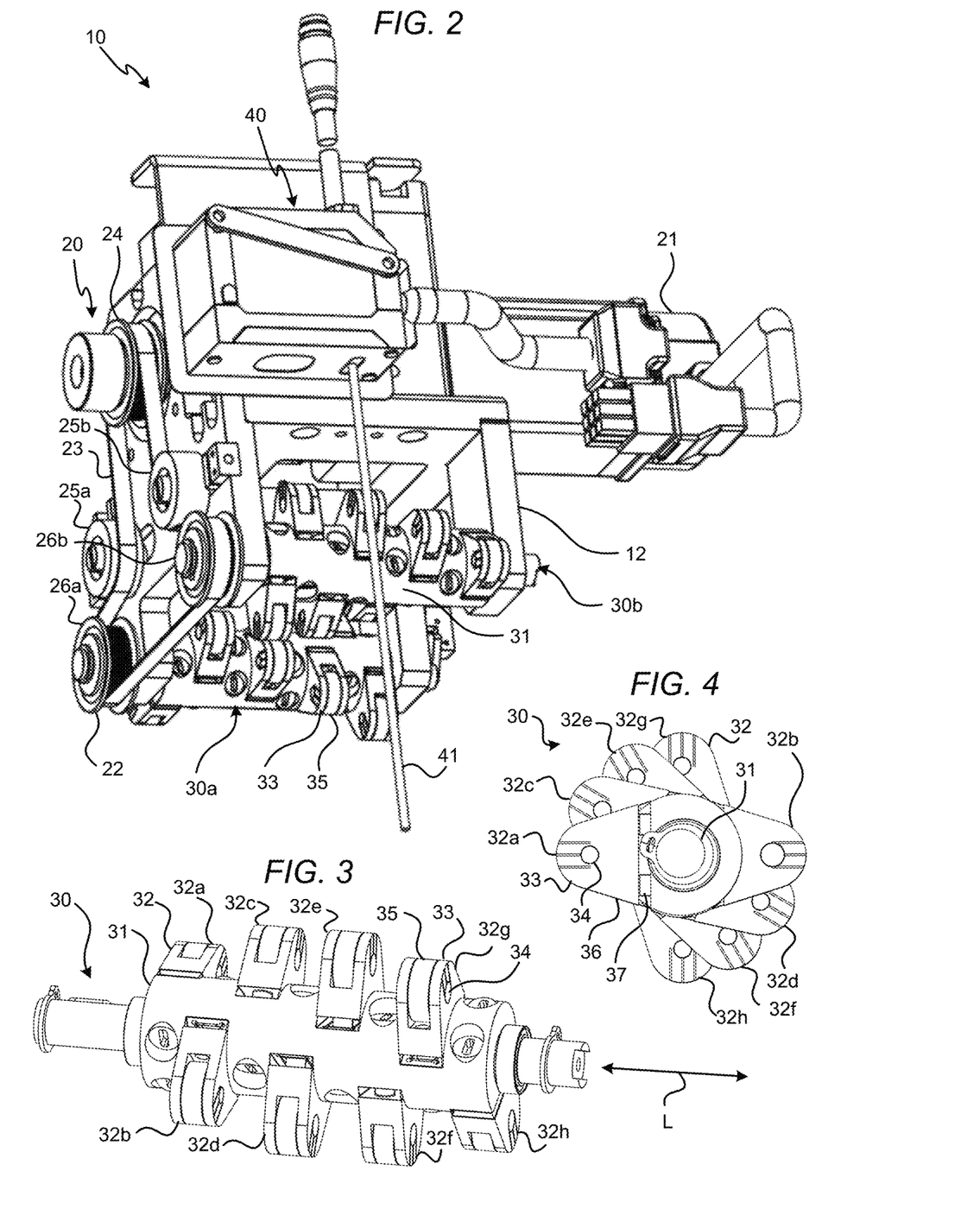
FIG. 2 shows a bottom perspective view of the memory insertion apparatus of FIG. 1 in accordance with aspects of the disclosure.
FIG. 3 shows a perspective view of one of the cam assemblies of FIG. 1 in accordance with aspects of the disclosure.
FIG. 4 shows an end view of one of the cam assemblies of FIG. 1 in accordance with aspects of the disclosure.

For example, and as illustrated in FIG. 1, a memory insertion apparatus 10 may include a frame 12, an actuation assembly 20, first and second cam assemblies 30a and 30b (collectively the cam assemblies 30), and a non-contact measuring device 40 (e.g., a laser-based non-contact measuring device) configured to emit an energy beam 41 (FIG. 2). The memory insertion apparatus 10 is configured to push a memory module 50 into a memory socket 51 mounted to a circuit board 52, such as a motherboard. The downward force applied by the memory insertion apparatus 10 may cause locking clips 53 to rotate inward towards the memory module 50 and to secure the memory module into the memory socket 51 when the memory module is fully inserted into the memory socket.

As shown in FIG. 2, the actuation assembly 20 includes a motor 21, pulleys 22, and a belt 23. While the actuation assembly 20 is shown as including five pulleys 22, other amounts of pulleys 22 may be used. For example, the number of pulleys may depend on the specific implementation of the cam assemblies 30. The pulleys 22 include a drive pulley 24, two guide pulleys 25a and 25b, and two cam assembly pulleys 26a and 26b that are rotationally fixed to the cam assemblies 30a and 30b, respectively. The drive pulley 24 is coupled to a driveshaft of the motor 21, such that when the motor rotates its driveshaft, the drive pulley rotates. The guide pulleys 25a and 25b help guide the belt so that it can extend around the cam assembly pulleys 26a and 26b. When the drive pulley 24 rotates, the cam assembly pulleys 26a and 26b rotate the respective cam assemblies 30a and 30b in a same rotational direction as the rotation direction of the drive pulley, either clockwise or counterclockwise. The rotation of the cam assembly pulleys 26a and 26b rotates the respective cam assemblies 30a and 30b that are rotationally fixed thereto.

As can be seen in FIGS. 2-4, each cam assembly 30 may include a central shaft 31 and eight cams 32 extending from the central shaft in a plurality of radial directions perpendicular to a longitudinal axis L of the central shaft. The cams 32 may each have a rounded generally triangular shape, such that each cam has a tip 33 that defines the farthest point of the cam from the central shaft. The cams 32 may each include a compliant material such as rubber or polyurethane, which helps limit the maximum force that is applied to the memory modules 50. For example, the cam 32 may include a carrier 36 made of metal or another strong material and a bushing 37 made of compliant material that sits between the carrier and the central shaft 31. In other examples, the cam may be made entirely of a compliant material. In such examples, the cam may exclude a dowel pin, ball bearing, and compliant bushing. The tips 33 of the cams 32 that contact the memory modules 50 may include a ball bearing 35 concentrically located by a dowel pin 34. The presence of the dowel pin 34 permits the ball bearing 35 to rotate when any lateral force is generated between the cams 32 and the corresponding memory modules 50, thereby limiting the pushing force to a direction that is normal to the memory modules.

The cams 32 are closely packed against one another along the longitudinal axis L of the central shaft 31. As used herein, "closely packed" means that a pitch distance between centers of adjacent ones of the cams 32 along the longitudinal axis L is about equal to a pitch distance between centers of adjacent ones of the memory sockets 51 into which the memory modules 50 are being installed. As shown in the figures, each cam assembly 30 has eight cams 32, but in other examples, each cam assembly may have other numbers of cams, such as 2, 4, 6, 9, 10, 12, 15, 18, or 20, among others, depending on the configuration of memory modules 50 being installed.

Each of the cams 32 is offset from the directly adjacent cam by 180° about a circumference of the cam assembly 30. As shown in FIG. 4, there are four 180°-offset directly adjacent pairs of cams. More specifically, the cams 32 include eight cams 32a-32h. If the first cam 32a is defined at a starting position of zero degrees, then the second cam 32b directly adjacent to the first cam is oriented at a position of 180° relative to the first cam 32a about the circumference of the cam assembly 30. Although an offset of 180° between directly adjacent cams is used in the examples shown, that need not be the case, and other offsets may be used, such as 90°, 120°, 150°, 210°, 240°, and 270°, among others.

Each successive odd-numbered cam 32 is oriented about 30° relative to the previous odd-numbered cam, such that the first, third, fifth, and seventh cams 32a, 32c, 32e, and 32g are oriented at 0°, 30°, 60°, and 90°. Each successive even-numbered cam is also oriented about 30° relative to the previous even-numbered cam, such that the second, fourth, sixth, and eight cams 32b, 32d, 32f, and 32h are oriented at 180°, 210°, 240°, and 270°. Although an offset of 30° between successive odd-numbered cams and successive even-numbered cams is used in the examples shown, that need not be the case, and other offsets may be used, such as 10°, 15°, 20°, 25°, 35°, and 45°, among others, depending on how many cams 32 each cam assembly 30 has or the particular configuration of the motherboard 52.

Figure 5:
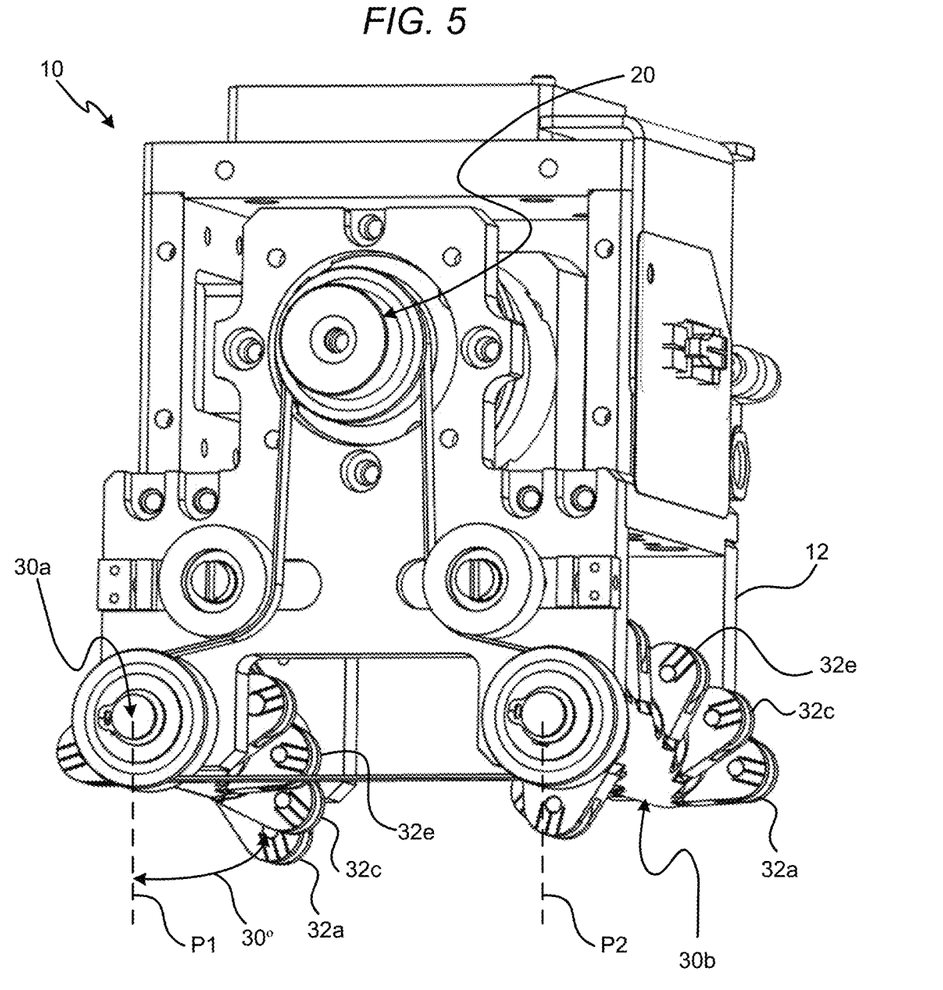
FIG. 5 shows a side perspective view of the memory insertion apparatus of FIG. 1 in accordance with aspects of the disclosure.
Figure 6:
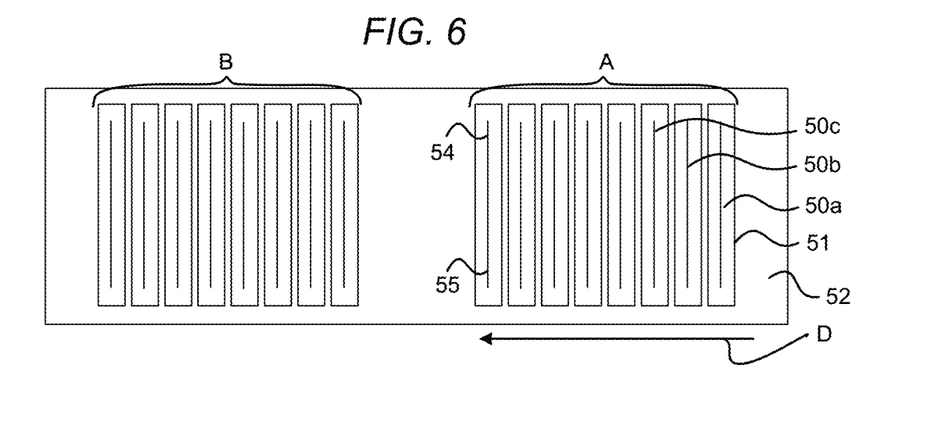
FIG. 6 illustrates an insertion pattern in accordance with aspects of the disclosure.

Referring to FIGS. 5 and 6, the cam assemblies 30a and 30b may work cooperatively to perform a rocking push-in of each of the memory modules 50 into the corresponding memory sockets 51, such that a first end 54 of an exposed longitudinal edge surface of each of the memory modules is pushed before a second end 55 thereof. The rocking push-in can be achieved because the first cam assembly 30a is rotationally offset about 60° relative to the second cam assembly 30b, such that when each cam assembly 30 is rotated in a same rotational direction, a center of each cam 32 of the first cam assembly passes through a first vertically oriented contact position P1 about 60° before a center of each corresponding cam of the second cam assembly passes through a second vertically oriented contact position P2. Although an offset of 60° between the first and second cam assemblies 30a and 30b is used in the examples shown, that need not be the case, and other offsets may be used, such as 15°, 30°, 45°, 75°, and 90°, among others, depending on how many cams 32 each cam assembly 30 has or the particular configuration of the motherboard 52.

As the memory insertion apparatus 10 approaches the motherboard 52, the cam assemblies 30a and 30b may be in the initial configuration shown in FIG. 5. The memory insertion apparatus 10 may be positioned over a first group A of the memory modules 50, with the first cam assembly 30a being positioned over a first end 54 of each of the memory modules, and with the second cam assembly 30b being positioned over a second end 55 of each of the memory modules.

In this initial configuration, the first cam 32a of the first cam assembly 30a is arranged at a position that is about 30° counterclockwise from the first contact position P1 (the rotational position at which the of the first cam assembly 30a cams will contact the first ends 54 of the memory modules 50). Also in this initial configuration, the first cam 32a of the second cam assembly 30b is arranged at a position that is about 90° counterclockwise from the second contact position P2 (the rotational position at which the cams of the second cam assembly 30b will contact the second ends 55 of the memory modules 50)

When the actuation assembly 20 rotates the cam assemblies 30 clockwise by about 30°, the first cam 32a of the first cam assembly 30a will be the first cam to reach the first contact position P1, thereby contacting and pushing down the first end 54 of the exposed longitudinal edge surface of a first one of the memory modules 50a. When the actuation assembly 20 rotates the cam assemblies 30 clockwise by another 30°, the third cam 32c of the first cam assembly 30a will be the second cam to reach the first contact position P1, thereby contacting and pushing down the first end 54 of a second one of the memory modules 50b.

When the actuation assembly 20 rotates the cam assemblies 30 clockwise by another 30°, the fifth cam 32e of the first cam assembly 30a will be the third cam to reach the first contact position P1, thereby contacting and pushing down the first end 54 of a third one of the memory modules 50c. At the same time, the first cam 32a of the second cam assembly 30b will be the first cam to reach the second contact position P2, thereby contacting and pushing down the second end 55 of the first one of the memory modules 50a. If each 30° rotation of the cam assemblies 30 takes about 1 millisecond, that would result in the second end 55 of the first memory module 50a being seated about 2 milliseconds after the first end 54 of the first memory module, thereby resulting in a rocking push-in of the first memory module over the 2-millisecond period. The sequence of rotational positions of the cam assemblies 30 that push down of the first end 54 and the second end 55 of each of the memory modules 50 in the first group A may be as shown in Table 1 below.

TABLE 1

| | First Cam Assembly 30a (Pushes First end 54) | Second Cam Assembly 30b (Pushes Second end 55) |
|---|---|---|
| First cam 32a | 30° | 90° |
| Third cam 32c | 60° | 120° |
| Fifth cam 32e | 90° | 150° |
| Seventh cam 32g | 120° | 180° |
| Second cam 32b | 210° | 270° |
| Fourth cam 32d | 240° | 300° |
| Sixth cam 32f | 270° | 330° |
| Eighth cam 32h | 300° | 0° |

As can be seen in table 1, every 30° of the rotational orientation of will result in no more than two cams pressing onto respective memory modules 50 at any one time, which will thereby limit the total force that is applied from the memory insertion apparatus 10 onto the motherboard 52 at any single moment in time. At some rotational orientations of the cam assemblies 30 (e.g., 30°), only one of the two cam assemblies will be pushing onto a respective memory module, and at other rotational orientations (e.g., 90°), each of the two cam assemblies will push onto a different respective memory module.

The opposite orientation of each two adjacent ones of the cams 32 will result in all of the odd-numbered memory modules in the group being seated first (when the orientation of the cam assemblies 30 is between 30° and 180°), and all of the even-numbered memory modules in the group being seated second (when the orientation of the cam assemblies 30 is between 210° and 0°). This effect can be seen in FIG. 1, which shows every other memory module 50 having been pushed down (the odd-numbered memory modules) and the remaining memory modules not yet having been pushed down (the even-numbered memory modules).

After a single complete rotation of each of the first and second cam assemblies 30a, 30b, all the memory modules 50 will have been pushed into the corresponding memory sockets 51, with the first end 54 and the second end 55 of each individual memory module being pushed at a different time. If desired, the first and second cam assemblies 30a, 30b may then be rotated again, in either the same direction or the opposite direction, to press each of the memory modules 50 again, just to make sure that the memory modules are fully seated into the corresponding memory sockets 51.

After all the memory modules 50 are fully seated, the memory insertion apparatus 10 may be moved in the direction D (FIG. 6) and positioned over a second group B of the memory modules 50, at which time the first and second cam assemblies 30a, 30b can be rotated again to seat the memory modules in the second group.

Figure 7:
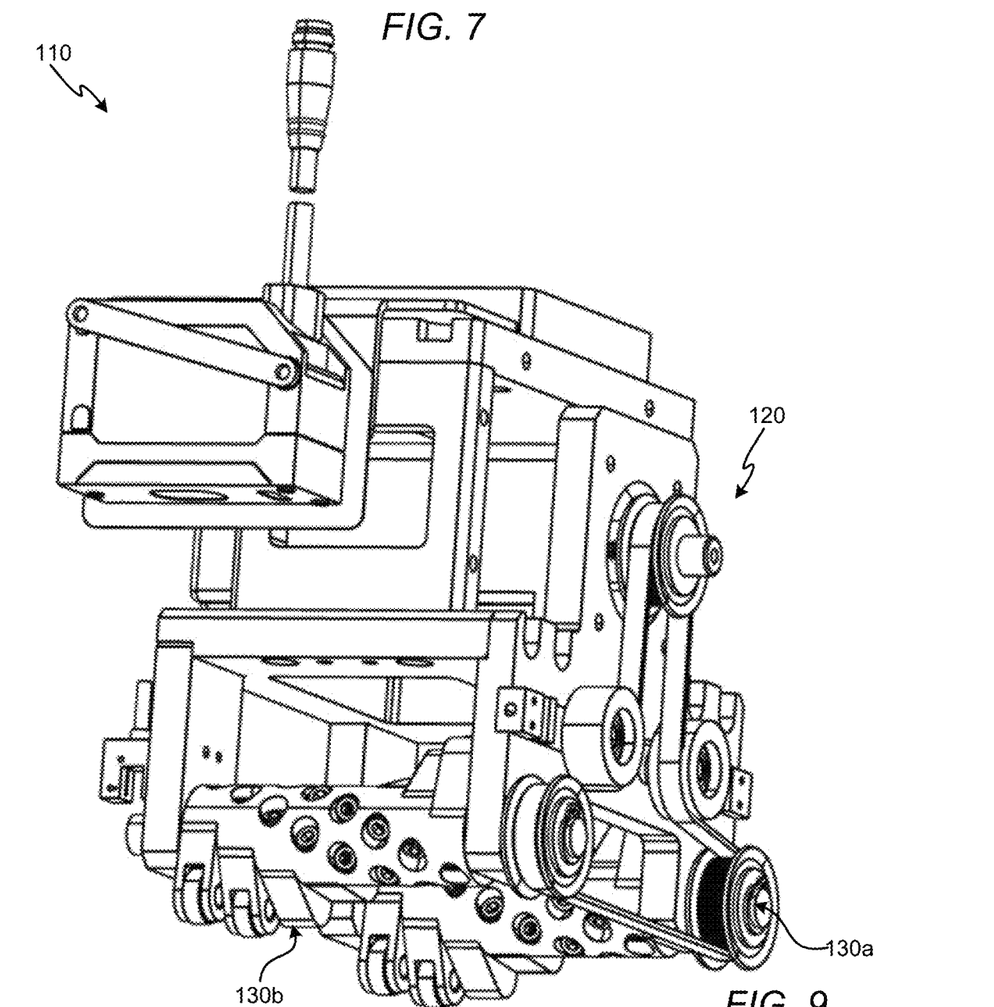
FIG. 7 shows a perspective view of a memory insertion apparatus that is a variation of the memory insertion apparatus of FIG. 1, in accordance with aspects of the disclosure.
Figure 8:
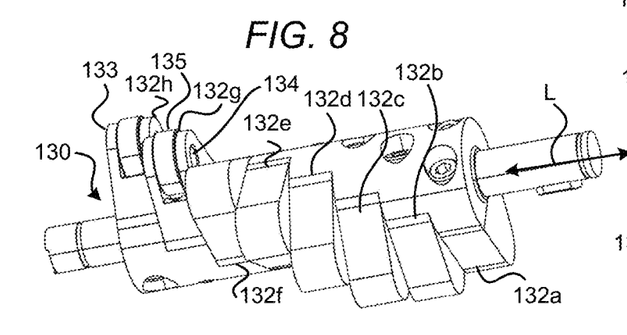
FIG. 8 shows a perspective view of one of the cam assemblies of FIG. 7 in accordance with aspects of the disclosure.
Figure 9:
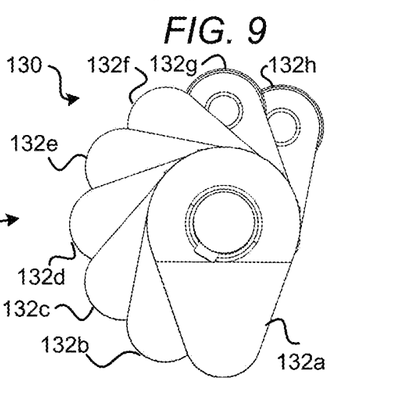
FIG. 9 shows an end view of one of the cam assemblies of FIG. 7 in accordance with aspects of the disclosure.

FIGS. 7-9 illustrate a memory insertion apparatus 110 that is a variation of the memory insertion apparatus 10 of FIGS. 1-5. The memory insertion apparatus 110 is similar to the memory insertion apparatus 10, except for the differences mentioned below.

The memory insertion apparatus 110 has eight cams 132a-132h, and each of the cams 132 is offset from the directly adjacent cam by about 30° about a circumference of the cam assembly 130. If the first cam 132a is defined at a starting position of zero degrees, then the second cam 132b directly adjacent to the first cam is oriented at a position of 30° relative to the first cam 132a about the circumference of the cam assembly 130. Each successive cam 132 is oriented about 30° relative to the previous odd-numbered cam, such that the first through eighth cams 132a-132h are oriented at 0°, 30°, 60°, 90°, 120°, 150°, 180°, and 210°. Although an offset of 30° between successive cams is used in the examples shown, that need not be the case, and other offsets may be used, such as 10°, 15°, 20°, 25°, 35°, and 45°, among others, depending on how many cams 132 each cam assembly 130 has or the particular configuration of the motherboard 52.

Similar to the cams 32, some of the cams 132 (132g and 132h) are illustrated as being made of a compliant material such as rubber or polyurethane, with the tips 133 including a ball bearing 135 concentrically located by a dowel pin 134. Others of the cams 132 (132a-132f) are illustrated as being made entirely of the compliant material without the dowel pin or ball bearing. In practice, in a single embodiment of the cam assembly 130, each of the cams 132 will have the same structure—all having the design of the cam 132a or all having the design of the cam 132g.

The cam assemblies 130a and 130b may work cooperatively to perform an in-phase push-in of each of the memory modules 50 into the corresponding memory sockets 51, such that a first end 54 and a second end 55 of an exposed longitudinal edge surface of each of the memory modules is pushed simultaneously. This can be accomplished by having the first cam assembly 130a is rotationally aligned in a same orientation relative to the second cam assembly 130b, such that when each cam assembly 130 is rotated in a same rotational direction, a center of each cam 132 of the first cam assembly passes through a first vertically oriented contact position simultaneously with when a center of each corresponding cam of the second cam assembly passes through a second vertically oriented contact position.

As the memory insertion apparatus 110 approaches the motherboard 52, the cam assemblies 130a and 130b may be in the initial configuration shown in FIG. 7. The memory insertion apparatus 110 may be positioned over a first group A of the memory modules 50 of FIG. 6, with the first cam assembly 130a being positioned over the first end 54 of each of the memory modules, and with the second cam assembly 130b being positioned over the second end 55 of each of the memory modules.

When the actuation assembly 120 rotates the cam assemblies 130 clockwise until the first cam 132a of each cam assembly reaches a corresponding contact position with the corresponding memory modules, the first cam of each cam assembly will contact and push down the first end 54 and the second end 55 of an exposed longitudinal edge surface of a first one of the memory modules 50a at the same time (i.e., in phase). When the actuation assembly 120 rotates the cam assemblies 130 clockwise by another 30°, the second cam 132c of each cam assembly 130 will reach the corresponding contact positions, thereby contacting and pushing down the first end 54 and the second end 55 of the second one of the memory modules 50b at the same time. This will continue in the same manner each time the actuation assembly 120 rotates the cam assemblies 130 clockwise by each successive 30° interval, until all eight memory modules 50 in the first group A are pushed into the corresponding memory sockets 51. This will result in an in-phase push-in of all eight of the memory modules 50.

The sequence of rotational positions of the cam assemblies 130 that push down on the first end 54 and the second end 55 of each of the memory modules 50 in the first group A may be as shown in Table 2 below.

TABLE 2

| | First Cam Assembly 130a (Pushes First end 54) | Second Cam Assembly 130b (Pushes Second end 55) |
|---|---|---|
| First cam 132a | 30° | 30° |
| Second cam 132b | 60° | 60° |
| Third cam 132c | 90° | 90° |
| Fourth cam 132d | 120° | 120° |
| Fifth cam 132e | 150° | 150° |
| Sixth cam 132f | 180° | 180° |
| Seventh cam 132g | 210° | 210° |
| Eighth cam 132h | 240° | 240° |

As can be seen in table 2, every 30° of the rotational orientation of will result in exactly two cams pressing onto the memory modules 50 at any one time, which will thereby limit the total force that is applied from the memory insertion apparatus 110 onto the motherboard 52 at any single moment in time.

After a single complete rotation of each of the first and second cam assemblies 130a, 130b, all the memory modules 50 will have been pushed into the corresponding memory sockets 51, with the first end 54 and the second end 55 of each individual memory module being pushed at a different time. If desired, the first and second cam assemblies 130a, 130b may then be rotated again, in either the same direction or the opposite direction, to press each of the memory modules 50 again, just to make sure that the memory modules are fully seated into the corresponding memory sockets 51.

After all the memory modules 50 are fully seated, the memory insertion apparatus 110 may be moved in the direction D (FIG. 6) and positioned over a second group B of the memory modules 50, at which time the first and second cam assemblies 130a, 130b can be rotated again to seat the memory modules in the second group.

Figure 10:
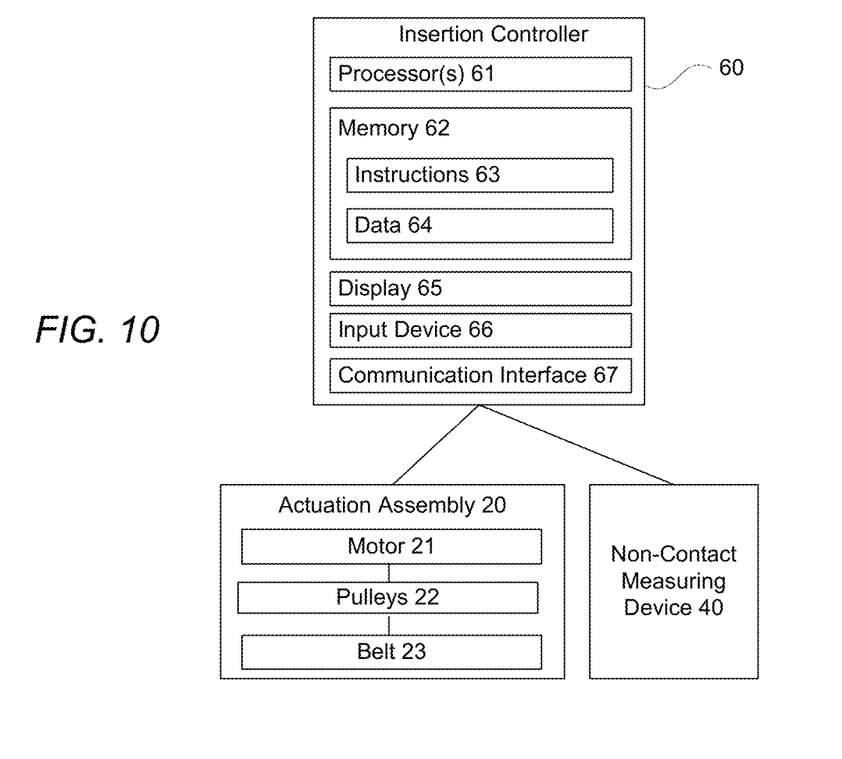
FIG. 10 shows a block diagram of an insertion controller in accordance with aspects of the disclosure.

The operation of the memory insertion apparatus 10 or 110 may be controlled by an insertion controller 60, shown in FIG. 10. The insertion controller 60 may include a processor 61 and memory 62. The processor may be any conventional processor. Alternatively, the processor may be a dedicated controller such as an application specific integrated circuit (ASIC), field programmable gate array (FPGA), etc. Additionally, the processor 61 may include multiple processors, multi-core processors, or a combination thereof. Although only one processor 61 is shown in FIG. 10, one of ordinary skill in the art would recognize that several processors may exist within insertion controller 60. Accordingly, references to a processor will be understood to include references to a collection of processors or dedicated logic that may or may not operate in parallel.

The memory 62 stores information accessible by the one or more processors 61, including instructions 63 and data 64 that may be executed or otherwise used by the processor 61. The memory 62 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 63 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 64 may be retrieved, stored or modified by processor 61 in accordance with the instructions 63. For instance, although the claimed subject matter is not limited by any particular data structure, the data may be stored in computing device registers, in a relational database as a table having a plurality of different fields and records, XML documents or flat files. The data may also be formatted in any computing device-readable format.

The insertion controller 60 may include all of the components normally used in connection with a computing device such as the processor and memory described above as well as an input device (e.g., a mouse, keyboard, touch screen, buttons, and/or microphone) and various electronic displays (e.g., a monitor having a screen or any other electrical device that is operable to display information). In this example, the insertion controller includes a display 65 as well as input device 66. In some instances, the display may be a touch screen display capable of operating as a user input. The input device 66 and/or display 65 may be used to receive a selection of a circuit board model into which memory modules are to be inserted by the memory insertion apparatus 10 or 110, as described herein.

The insertion controller 60 may also include a communication interface 67 to facilitate communication with other computing and storage devices. The communication interface 67 may include wired or wireless communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, Wi-Fi and HTTP, and various combinations of the foregoing.

The insertion controller 60 may store in memory 62 position data of one or more circuit board models. The position data for each circuit board model may include the locations of memory sockets relative to a known location. For instance, the memory insertion apparatus 10 or 110 may have a known location where circuit boards are positioned relative to an initial starting position of the memory insertion apparatus. In some instances, the position data may be retrieved by the insertion controller 60 from another storage device, such as a networked attached storage device.

The insertion controller 60 may be configured to communicate with the non-contact measuring device 40 that measures the distance between the cam assemblies 30 and 130 and the memory modules 50. The insertion controller 60 may be configured to communicate with the motor 21 of the actuation assembly 20, to control the rotation of the pulleys 22 and the belt 23, which in turn rotate the cam assemblies 30 and 130. In this regard, based on the position data and known location, the insertion controller 60 may communicate with the actuation assembly 20 to rotate the cams 32 and 132 relative to the memory modules 50 on the circuit board 52 to push the memory modules into the respective memory sockets 51. This process may be repeated until memory modules 50 are inserted into all memory sockets 51 on the circuit board 52. The actuation assembly 20 may also have other components that are configured to move the entire memory insertion apparatus 10 or 110 relative to the circuit board 52, between groups of the memory modules 50 such as the first and second groups A and B shown in FIG. 6.

Figure 11:
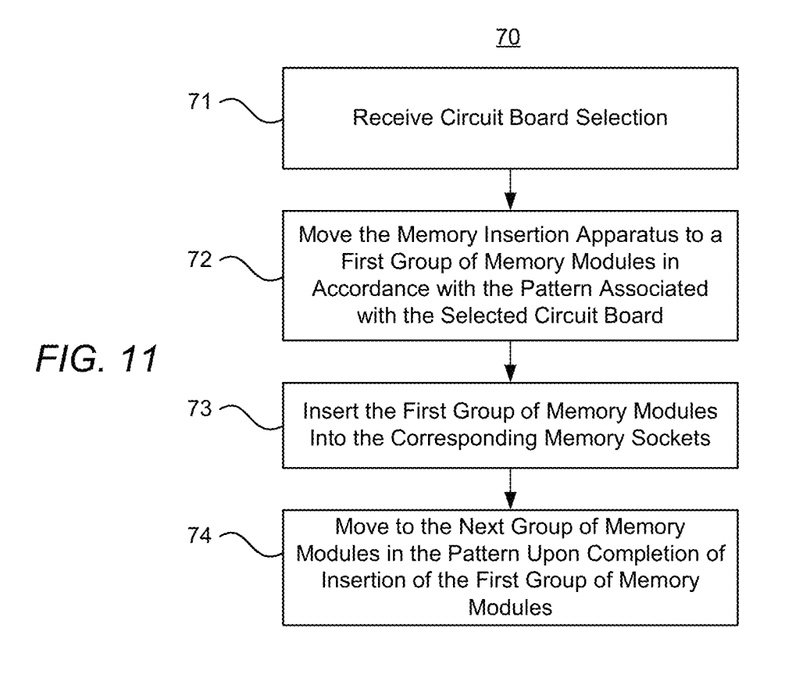
FIG. 11 is a flow chart illustrating an example method in accordance with one aspect of the disclosure.

Referring to FIG. 11, in addition to the operations described above and illustrated in the figures, various operations will now be described. The following operations do not have to be performed in the precise order described below. Rather, various steps can be handled in a different order or simultaneously, and steps may also be added or omitted. FIG. 11 illustrates a flow chart 70 showing an example memory insertion operation of the memory insertion apparatus 10 or 110. As shown in block 71, the memory insertion apparatus 10 or 110 may receive a selection of a circuit board model 52 via an input or command, such as a selection on input device 66.

As shown in block 72, based on the selection, the insertion controller 60 may control the actuation assembly 20 such that it moves the memory insertion apparatus 10 or 110 to a first group A of the memory modules 50. In this regard, the insertion controller 60 may control the actuation assembly 20, including the motor 21, the pulleys 22, the belt 23, and other components that move the entire memory insertion apparatus 10 or 110, such that the memory insertion apparatus is moved in accordance with a pattern corresponding to the selected circuit board model 52.

As shown in block 73, at each group of the memory modules 50, the memory insertion apparatus 10 or 110 may insert the group A of memory modules into the corresponding memory sockets 51. When the insertion is completed, the insertion controller 60 may control the actuation assembly 20 and advance the memory insertion apparatus 10 or 110 to the next group B of the memory module 50 in the pattern, as shown in block 74. Then, steps 73 and 74 may be repeated until all groups of the memory modules 50 are inserted into the corresponding memory sockets 51.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method for pushing memory modules into corresponding memory sockets with an automated memory insertion apparatus, the method comprising:
    rotating one or more cam assemblies relative to a frame, each cam assembly having a central shaft extending in a longitudinal direction and a plurality of cams each extending from the central shaft in a respective radial direction perpendicular to the longitudinal direction, a center of each cam of each of the cam assemblies being offset from centers of adjacent ones of the cams by a pitch distance that is equal to a pitch distance between centers of adjacent ones of the memory sockets; and
    applying, by the cams, an insertion force to the memory modules in the corresponding memory sockets.

2. The method of claim 1, wherein the applying includes the one or more cam assemblies together cooperatively performing a rocking push-in of each of the memory modules into the corresponding memory sockets, such that a first end of each of the memory modules is pushed before a second end thereof.

3. The method of claim 1, wherein the one or more cam assemblies comprise a first cam assembly and a second cam assembly, and wherein the first cam assembly is rotationally offset relative to the second cam assembly, such that during the rotating, each cam of the first cam assembly contacts a first end of a corresponding one of the memory modules before a corresponding cam of the second cam assembly contacts a second end of the corresponding one of the memory modules.

4. The method of claim 1, wherein each cam of each of the cam assemblies is offset from an adjacent one of the cams by 120° to 240° about a circumference of the central shaft, such that during the applying, in a sequence, a group of the memory modules, all odd-numbered memory modules in the sequence are inserted into the corresponding memory sockets before any of the even-numbered memory modules in the sequence are inserted into the corresponding memory sockets.

5. The method of claim 1, wherein the applying includes the one or more cam assemblies together cooperatively performing an in-phase push-in of each of the memory modules into the corresponding memory sockets, such that a first end and a second end of each of the memory modules is pushed simultaneously.

6. The method of claim 1, wherein the one or more cam assemblies comprise a first cam assembly and a second cam assembly, and wherein the first cam assembly is rotationally aligned in a same orientation relative to the second cam assembly, such that during the rotating, each cam of the first cam assembly contacts a first end of a corresponding one of the memory modules simultaneously with when a corresponding cam of the second cam assembly contacts a second end of the corresponding one of the memory modules.

7. The method of claim 1, further comprising measuring a distance between the cam assemblies and the memory module.

8. The method of claim 7, wherein the measuring is performed by a non-contact measuring device.

9. The method of claim 1, further comprising offsetting each cam of each of the one or more cam assemblies from an adjacent one of the cams by 120° to 240° about a circumference of the central shaft.

10. The method of claim 1, further comprising arranging the cams of each of the one or more cam assemblies in sequence having odd-numbered and even-numbered ones of the cams.

11. The method of claim 10, wherein each odd-numbered cam of each of the cam assemblies is offset from a closest one of the odd-numbered cams by 15° to 45° about a circumference of the central shaft.

12. The method of claim 10, wherein each even-numbered cam of each of the cam assemblies is offset from a closest one of the even-numbered cams by 15° to 45° about a circumference of the central shaft.

13. The method of claim 1, wherein each of the cam assemblies includes eight cams.

14. The method of claim 1, wherein each of the cams has a rounded generally triangular shape.

15. The method of claim 1, wherein each of the one or more cam assemblies includes an identical number and arrangement of cams.

\* \* \* \* \*